United States Patent [19]
Ruetz

[11] Patent Number: 5,155,384
[45] Date of Patent: Oct. 13, 1992

[54] BIAS START-UP CIRCUIT

[75] Inventor: J. Eric Ruetz, San Bruno, Calif.

[73] Assignee: Samsung Semiconductor, Inc., San Jose, Calif.

[21] Appl. No.: 698,423

[22] Filed: May 10, 1991

[51] Int. Cl.⁵ .............................................. H03K 3/01
[52] U.S. Cl. ................................ 307/296.8; 307/296.2
[58] Field of Search ........................... 307/296.2, 296.8

[56] References Cited

U.S. PATENT DOCUMENTS

| | | | |
|---|---|---|---|
| 4,342,926 | 8/1982 | Whatley | 307/296.8 |
| 4,450,367 | 5/1984 | Whatley | 307/296.8 |
| 4,461,991 | 7/1984 | Smith | 307/296.8 |
| 4,495,425 | 1/1985 | McKenzie | 307/296.8 |
| 5,055,719 | 10/1991 | Hughes | 307/296.8 |

Primary Examiner—Edward P. Westin
Assistant Examiner—Richard Roseen
Attorney, Agent, or Firm—Townsend and Townsend

[57] ABSTRACT

A start-up circuit for a bias generating circuit includes a current source for providing a small charging current, and transistors for coupling the charging current to the bias generating circuit during power up to force the bias generating circuit into a steady-current state. The start-up circuit also uncouples the current source from the bias circuit after the bias generating circuit is forced into the steady-current state to prevent the charging current from affecting the operation of the bias generating circuit.

3 Claims, 1 Drawing Sheet

BIAS START-UP CIRCUIT

BACKGROUND OF THE INVENTION

Bias generating circuits utilizing several current paths including transistors coupled together in a current-mirror configuration are widely used. These circuits have two stable operating states, a zero-current state and a steady-current state. When power is turned on the bias generating circuit may settle in either state.

If the circuit settles in the zero-current state it must be forced into the steady-current state.

A standard technique for forcing the bias circuit into the steady-current state during power up is to bleed a small amount of current into a node in a selected one of the current paths. A problem with this technique is that small amount of current continues to flow through the selected current path after the bias circuit is operating and degrades the accuracy of the bias voltage and/or current levels of the output signals.

SUMMARY OF THE INVENTION

The present invention is a start-up circuit for forcing the bias generating circuit into the steady-current state during power up. According to one aspect of the invention, a current source is connected to a node in one of the current paths of the bias generating circuit when power is turned on and the bias generating circuit is in the zero-current state. This start-up current supplied by the current source forces the bias generating circuit into the steady-current state. Subsequent to start-up, the current source is disconnected from the node in the current path so that the operation of the bias generating circuit is not affected by the start-up current from the current source.

According to another aspect of the invention, a charging node in the start-up circuit is charged by the current source when power is turned on and the bias generating circuit is in the zero-current state. When this charging node is charged it turns on a coupling transistor coupling the charging node to the node in the current path and the transistor conducts start-up current from the current source to the node in the current path to force the bias generating circuit into the steady-current state. A discharging transistor is turned on when the bias generating circuit is the steady-current state which discharges the charging node and turns off the coupling transistor. Accordingly, the current source is isolated from the node in the current path once the bias generating circuit is in the steady-current state.

Other advantages and features of the invention will become apparent in view of the appended drawings and following detailed description.

DETAILED DESCRIPTION OF THE PREFERRED EMBODIMENTS

Figure 1:
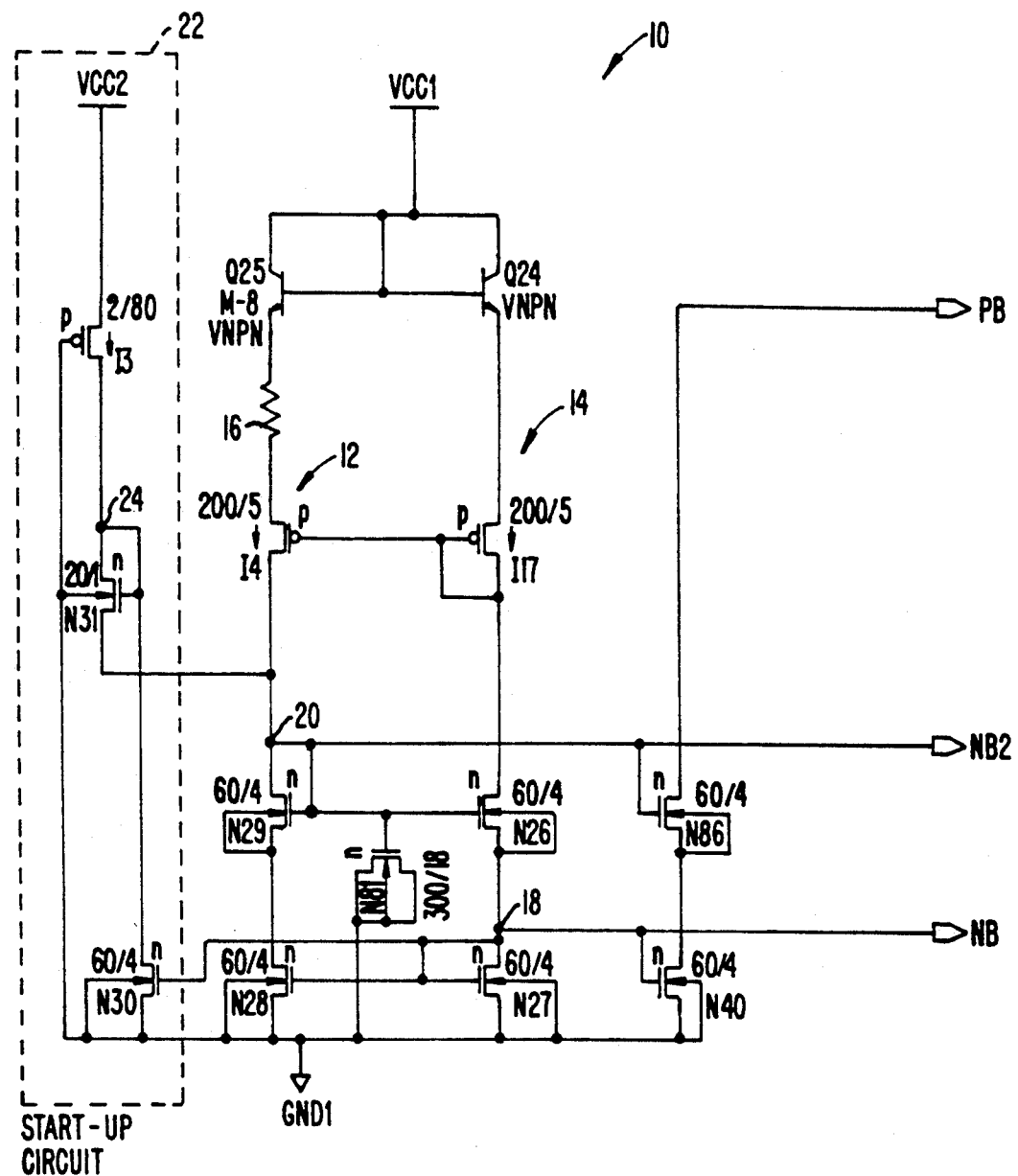
FIG. 1 is a schematic diagram of a preferred embodiment of the invention.

FIG. 1 is a circuit diagram of a preferred embodiment of the invention. In FIG. 1 a bias circuit 10 consists of first and second current paths 12 and 14. Each current path consists of identical circuit elements except that the first current path 12 includes a bias resistor 16. A first bias voltage output nb is coupled to a first output node 18 in the second current path 14. A second bias voltage output nb2 is coupled to a second output node 20 in the first current path 12. The first and second output nodes 18 and 20 are coupled, respectively, to the gates of transistors N40 and N86 to provide a bias current signal at output pb.

A bias start-up circuit 22 consists of a P-channel transistor I3 having its source coupled to VCC, its gate coupled to ground, and it drain coupled to a charging node 24, an N-channel transistor N31 having its drain and gate coupled to the charging node 24, and its source coupled to the second output node 20, and an N-channel transistor N30 having its drain coupled to the charging node 24, its source is coupled to ground, and its gate is coupled to node 18.

The operation of the bias start-up circuit will now be described. When power is turned on the voltage at the drain of I17 may be equal to VCC so that the circuit is in the zero-current state. However, when power is turned on and the circuit is in the zero-current state I3 in the start-up circuit 22 is on and N31 and N30 are off. I3 has a small W/L ratio and conducts only a few microamps of current and functions as a bleeder resistor furnishing current to the charging node 24. However, after a short time the charging node 24 is charged to the point where the gate voltage of N31 is sufficiently high to turn on N31. Current then flows through I3 and N31 and charges the second output node 20 to build up a voltage level on that node which forces the bias generating circuit into the steady-current state.

Once the bias circuit is in the steady-current state the voltage built up at the first output node 18, which is coupled to the gate of N30, turns N30 on. Transistor I3 is sized so that the current supplied to the charging node 24 is less than 1/5 the steady-current state N30 bias current. Thus, the charging node 24 is discharged to turn off N31 when the bias circuit is in the steady-current state.

Once N31 is turned off the start-up circuit no longer conducts current into the second output node 20 and therefore has no effect on the operation of the bias circuit. The discharging of the charging node 24 effectively isolates the current conducted by I3 from the bias circuit 10 during operation. Further, the only current drawn by the start-up circuit is the current through I3 which is only a few microamps. Thus, the power dissipation of the start-up circuit is negligible.

The invention has now been described with reference to a preferred embodiment. Alternatives and substitutions will now be apparent to persons of skill in the art. In particular, while a p-channel transistor is used as a bleeder resistor other types of circuit elements, such as a polysilicon resistor, could be substituted. Further, devices of opposite polarity can be utilized by switching voltage rails and transistor types. Accordingly, it is not intended to limit the invention except as provided by the appended claims.

What is claimed is:

1. A start-up circuit for charging a selected node in a current path of a bias generating circuit having multiple current paths to force the bias generating circuit into a steady-current state when power is turned on, said start-up circuit comprising:

means, coupling a power supply voltage to a charging node, for conducting a charging current to charge said charging node when power is turned on and the bias generating circuit is in a zero-current state;

a first transistor, which is turned on when said charging node is charged, for conducting current from said charging node to the selected node in the current path to force the bias generating circuit into the steady-current state; and a second transistor, coupled to said charging node, which is turned on when the bias generating circuit is in the steady-current state to conduct substantially more current than the charging current conducted by said selected node, for discharging said charging node to turn off said first transistor, and to isolate the start-up circuit from said means for conducting after the bias generating circuit is forced into the steady-current state.

2. The circuit of claim 1 wherein said means for conducting is a forward-biased transistor.

3. The circuit of claim 1 wherein said means for conducting is a resistor.

* * * * *